United States Patent
Qu

(10) Patent No.: US 9,939,941 B2
(45) Date of Patent: Apr. 10, 2018

(54) TOUCH PANEL, MANUFACTURING METHOD THEREOF AND TOUCH DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Lianjie Qu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/037,105

(22) PCT Filed: Oct. 20, 2015

(86) PCT No.: PCT/CN2015/092300
§ 371 (c)(1),
(2) Date: May 17, 2016

(87) PCT Pub. No.: WO2016/201838
PCT Pub. Date: Dec. 22, 2016

(65) Prior Publication Data
US 2017/0168617 A1    Jun. 15, 2017

(30) Foreign Application Priority Data

Jun. 15, 2015  (CN) .......................... 2015 1 0330811

(51) Int. Cl.
*G06F 3/045* (2006.01)
*G06F 3/041* (2006.01)
(Continued)

(52) U.S. Cl.
CPC ........ *G06F 3/0412* (2013.01); *G02F 1/13338* (2013.01); *G02F 1/13439* (2013.01);
(Continued)

(58) Field of Classification Search
CPC ....... G06F 3/0412; G06F 3/044; G06F 3/0416
See application file for complete search history.

(56) References Cited

U.S. PATENT DOCUMENTS

2007/0195029 A1* 8/2007 Jeon .................... G02F 1/13338
345/87
2012/0218199 A1* 8/2012 Kim ...................... G06F 3/0412
345/173
(Continued)

FOREIGN PATENT DOCUMENTS

| CN | 102881839 A | 1/2013 |
| CN | 103699284 A | 4/2014 |

(Continued)

OTHER PUBLICATIONS

International Search Report and Written Opinion with English Language Translation, dated Mar. 21, 2016, Application No. PCT/CN2015/092300.
(Continued)

*Primary Examiner* — Nan-Ying Yang
(74) *Attorney, Agent, or Firm* — Womble Bond Dickinson (US) LLP

(57) ABSTRACT

The present disclosure provides a touch panel, a manufacturing method thereof and a touch display device. The method comprises: 1) forming touch lines, comprising: forming in the same layer gate lines and a plurality of first touch lines, each first touch line being arranged intermittently in a direction of data lines and not electrically connected with the gate lines, and forming in the same layer a plurality of first connection lines and electrodes not in the
(Continued)

same layer as the gate lines and the touch electrodes, each first connection line being used for connecting in series with an intermittent first touch line, each touch line comprising a first touch line and a plurality of first connection lines; and 2) forming touch electrodes, each touch electrode being electrically connected with one or more first touch lines, one or more second touch lines, or one or more third touch lines.

8 Claims, 8 Drawing Sheets

(51) Int. Cl.
| | | |
|---|---|---|
| H01L 27/12 | (2006.01) | |
| G06F 3/044 | (2006.01) | |
| G06F 3/047 | (2006.01) | |
| G02F 1/1362 | (2006.01) | |
| G02F 1/1333 | (2006.01) | |
| G02F 1/1343 | (2006.01) | |

(52) U.S. Cl.
CPC .. *G02F 1/133345* (2013.01); *G02F 1/134309* (2013.01); *G02F 1/136286* (2013.01); *G06F 3/044* (2013.01); *G06F 3/047* (2013.01); *H01L 27/124* (2013.01); *H01L 27/1262* (2013.01); *G02F 2001/136295* (2013.01); *G02F 2201/121* (2013.01); *G02F 2201/123* (2013.01); *G06F 2203/04103* (2013.01)

(56) References Cited

U.S. PATENT DOCUMENTS

| | | |
|---|---|---|
| 2013/0207899 A1 | 8/2013 | Wang et al. |
| 2013/0306946 A1* | 11/2013 | Chang ................ H01L 27/323 257/40 |
| 2014/0091286 A1 | 4/2014 | Ma |
| 2016/0004346 A1 | 1/2016 | Zhao |
| 2016/0041665 A1* | 2/2016 | Gwon .................... G06F 3/044 345/174 |

FOREIGN PATENT DOCUMENTS

| | | |
|---|---|---|
| CN | 103995635 A | 8/2014 |
| CN | 104020595 | 9/2014 |
| CN | 104536637 | 4/2015 |
| CN | 104900658 | 9/2015 |

OTHER PUBLICATIONS

Office Action in Chinese Application No. 201510330811.2 dated May 17, 2017, with English translation.

* cited by examiner

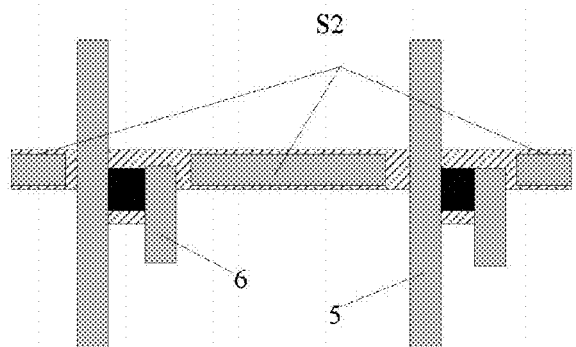
Fig. 4c
Fig. 4d
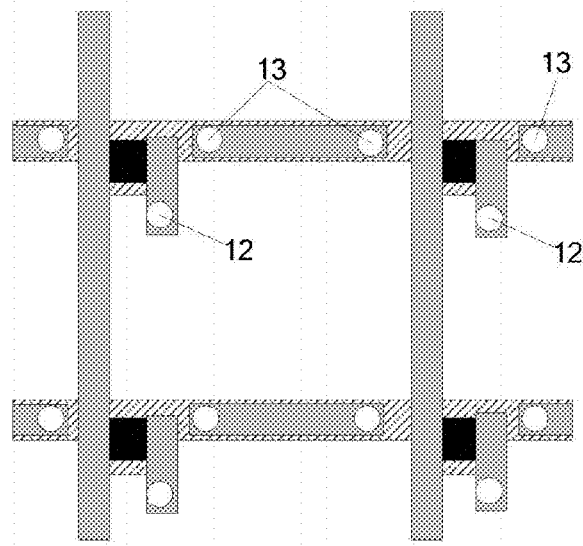
Fig. 4e

US 9,939,941 B2

TOUCH PANEL, MANUFACTURING METHOD THEREOF AND TOUCH DISPLAY DEVICE

The present application is the U.S. national phase entry of PCT/CN2015/092300, with an international filing date of Oct. 20, 2015, which claims the benefit to Chinese Patent Application No. 201510330811.2, filed on Jun. 15, 2015, the entire disclosures of which are incorporated herein by reference.

FIELD

The present disclosure relates to the field of liquid crystal display technologies, and specifically to a touch panel, a manufacturing method thereof, and a touch display device.

BACKGROUND ART

In-cell touch display panel is a development trend for display products. Nowadays, there are both self-capacitance in-cell touch display panels and mutual-capacitance in-cell touch display panels, wherein self-capacitance in-cell touch display panels are widely used due to their advantages such as a higher signal-noise ratio and a simpler process.

In an in-cell touch display panel, a common electrode (Vcom) of a pixel unit is usually reused as touch electrodes. FIG. 1 is a schematic view for a pattern of touch electrodes which is obtained by dividing a common electrode. As shown in FIG. 1, the common electrode is cut into touch electrodes having a certain pattern. FIG. 2 is a partial longitudinal cross-sectional view for an ordinary self-capacitance in-cell touch panel. Referring to both FIG. 1 and FIG. 2, a manufacturing method of the self-capacitance in-cell touch panel usually comprises the following steps:

1) forming patterns of a gate 10 and gate lines;
2) forming a gate insulating layer 11;
3) forming an active region 12;
4) forming patterns of a source 13, a drain 14 and data lines;
5) forming a pattern of a pixel electrode 15, the pixel electrode 15 being electrically connected with the drain 14;
6) forming an insulating layer 16, the insulating layer 16 being provided for electrically isolating a common electrode 20 from a touch line 17;
7) forming a pattern of a touch line 17, the touch line 17 being electrically connected with an integrated chip or a processing circuit and used as a driving and receiving signal line for touch electrodes 18, the touch electrodes 18 being part of the common electrode 20;
8) forming an insulating layer 19, the insulating layer 19 being used for electrically isolating the common electrode from the touch line 17 and having one or more via holes provided therein;
9) forming a pattern of touch electrodes 18 and filling the via hole(s) such that the touch electrodes 18 are electrically connected with the touch line 17 via the via hole(s).

As can be known from the above, the existing manufacturing method of a self-capacitance in-cell touch panel requires at least nine processes including film deposition, masking and etching, which leads to a complicated process and accordingly a high production cost.

SUMMARY

The present disclosure aims to at least solve one of the technical problems existing in the prior art and proposes a touch panel, a manufacturing method thereof and a touch display device capable of reducing the manufacturing process steps of a self-capacitance in-cell touch panel and accordingly simplifying the process.

According to a first aspect of the present disclosure, a method for manufacturing a touch panel is provided, the touch panel comprising intersecting gate lines and data lines, touch electrodes and a plurality of touch lines, the gate lines and the data lines defining display pixels comprising pixel electrodes, the method comprising the following steps:

forming touch lines, comprising:

forming in the same layer gate lines and a plurality of first touch lines, each first touch line being arranged intermittently in a direction of data lines and not electrically connected with the gate lines, and forming in the same layer a plurality of first connection lines and electrodes which are not in the same layer as the gate lines and the touch electrodes, each first connection line being used for connecting in series with an intermittent first touch line, each touch line comprising a first touch line and a plurality of first connection lines; or forming in the same layer data lines and a plurality of second touch lines, each second touch line being arranged intermittently in a direction of the gate lines and not electrically connected with the data lines, and forming in the same layer a plurality of second connection lines and electrodes which are not in the same layer as the data lines and the touch electrodes, each second connection line being used for connecting in series with an intermittent second touch line, each touch line comprising a second touch line and a plurality of second connection lines; or forming in the same layer a plurality of third touch lines and pixel electrodes which are not in the same layer as the data lines and the gate lines, each third touch line being arranged continuously, each touch line comprising a third touch line; and forming touch electrodes, each touch electrode being electrically connected with one or more first touch lines, one or more second touch lines, or one or more third touch lines.

In one implementation, each display pixel further comprises a gate, a drain, a source and an active region, and the touch panel further comprises a gate insulating layer and a first insulating layer. Forming touch lines specifically comprises: forming in the same layer a gate, gate lines and a plurality of first touch lines; forming between the gate and the active region a gate insulating layer with a plurality of first via holes provided therein; forming in the same layer a source, a drain, data lines, a pixel electrode and a plurality of first connection lines; and forming between the pixel electrode and the touch electrodes a first insulating layer with a plurality of second via holes provided therein. Forming touch electrodes comprises: electrically connecting each touch electrode with one or more first touch lines via one or more second via holes.

In one implementation, each display pixel further comprises a gate, a drain, a source and an active region, and the touch panel further comprises a gate insulating layer and a second insulating layer. Forming touch lines specifically comprises: forming in the same layer a gate, gate lines and a plurality of first touch lines; forming between the gate and the active region a gate insulating layer with a plurality of first via holes provided therein; forming between the source, the drain and the pixel electrode a second insulating layer with a plurality of third via holes and a plurality of fourth via holes provided therein, each pixel electrode and each drain being electrically connected via a corresponding third via hole; and forming between the pixel electrodes and the touch electrodes a first insulating layer with a plurality of second via holes provided therein. Forming the touch electrodes comprises: if the plurality of first connection lines, the source, the drain and the data lines are formed in the same layer, arranging the fourth via holes to have a one-to-one correspondence with the second via holes, such that each first connection line is connected in series with an intermittent first touch line via two corresponding first via holes and that each first touch line is electrically connected with a corresponding touch electrode via one or more second via holes and one or more fourth via holes; if the plurality of first connection lines and the pixel electrodes are formed in the same layer, arranging the fourth via holes to have a one-to-one correspondence with the first via holes, such that each first connection line is connected in series with an intermittent first touch line via two corresponding first via holes and two corresponding fourth via holes and that each first touch line is electrically connected with a corresponding touch electrode via one or more second via holes.

In one implementation, each display pixel further comprises a drain and a source, and the touch panel further comprises a second insulating layer and a first insulating layer. Forming touch lines specifically comprises: forming in the same layer a source, a drain, data lines and a plurality of second touch lines; forming between the source, the drain and the pixel electrodes a second insulating layer with a plurality of third via holes and a plurality of fourth via holes provided therein, each pixel electrode and each drain being electrically connected via a corresponding third via hole; forming in the same layer pixel electrodes and a plurality of second connection lines, each second connection line being connected in series with an intermittent second touch line via two corresponding fourth via holes; and forming between the pixel electrodes and the touch electrodes a first insulating layer with a plurality of second via holes provided therein. Forming the touch electrodes comprises: electrically connecting each touch electrode with one or more second touch lines via one or more second via holes.

In one implementation, each display pixel further comprises a drain and a source, and the touch panel further comprises a second insulating layer and a first insulating layer. Forming touch lines specifically comprises: forming in the same layer a source, a drain and data lines; forming between the source, the drain and the pixel electrodes a second insulating layer with a plurality of third via holes provided therein, each pixel electrode and each drain being electrically connected via a corresponding third via hole; forming in the same layer pixel electrodes and a plurality of third touch lines; forming between the pixel electrodes and the touch electrodes a first insulating layer with a plurality of second via holes provided therein. Forming touch electrodes comprises: electrically connecting each touch electrode with one or more third touch lines via one or more second via holes.

In one implementation, each first touch line is provided with a plurality of via hole connection parts, each of which is located in a disconnection position of a corresponding first touch line in the vicinity of a gate line and protrudes in a direction of the gate line; the first via holes are arranged to have a one-to-one correspondence with the via hole connection parts; and each second via hole is arranged in a random position on a corresponding first connection line.

In one implementation, each first touch line is provided with a plurality of via hole connection parts, each of which is located in a disconnection position of a corresponding first touch line in the vicinity of a gate line and protrudes in a direction of the gate line. Forming the touch electrodes further comprises: if the plurality of first connection lines, the source, the drain and the data lines are formed in the same layer, arranging the first via holes to have a one-to-one correspondence with the via hole connection parts, and arranging each of the second via holes and the fourth via holes in a random position on a corresponding first connection line; if the plurality of first connection lines and the pixel electrodes are formed in the same layer, arranging each of the first via holes and the fourth via holes to have a one-to-one correspondence with a corresponding via hole connection part, and arranging each of the second via holes in a random position on a corresponding first connection line.

In one implementation, forming touch lines specifically comprises: forming simultaneously gate lines and said plurality of first touch lines, and forming simultaneously said plurality of first connection lines and electrodes which are not in the same layer as the gate lines and the touch electrodes; or, forming simultaneously data lines and said plurality of second touch lines, and forming simultaneously said plurality of second connection lines and electrodes which are not in the same layer as the data lines and the touch electrodes; or forming simultaneously pixel electrodes and said plurality of third touch lines.

According to a second aspect of the present disclosure, a touch panel is further provided, comprising intersecting gate lines and data lines, touch electrodes and a plurality of touch lines, the gate lines and the data lines defining display pixels comprising pixel electrodes. Each touch line comprises a first touch line arranged intermittently in a direction of the data lines and not electrically connected with the gate lines, and a plurality of first connection lines used for connecting in series with an intermittent first touch line, the first touch line being arranged in the same layer as the gate lines, the plurality of first connection lines being arranged in the same layer as electrodes which are not in the same layer as the gate lines and the touch electrodes. Alternatively, each touch line comprises a second touch line arranged intermittently in a direction of the gate lines and not electrically connected with the data lines, and a plurality of second connection lines used for connecting in series with an intermittent second touch line, the second touch lines being arranged in the same layer as the data lines, the plurality of second connection lines being arranged in the same layer as electrodes which are not in the same layer as the data lines and the touch electrodes. Alternatively, each touch line is a third touch line arranged continuously, the third touch line being arranged in the same layer as pixel electrodes which are not in the same layer as the data lines and the gate lines. Also, each touch electrode is electrically connected with one or more first touch line, one or more second touch line or one or more third touch line.

In one implementation, each display pixel further comprises a gate, a drain and a source, and the touch panel further comprises a gate insulating layer and a first insulating layer. The gate insulating layer is arranged between the source, the drain and the gate, and has a plurality of first via holes provided therein. The plurality of first connection lines are arranged in the same layer as the source, the drain, the data lines and the pixel electrodes, each first connection line being connected in series with an intermittent first touch line via two corresponding first via holes. The first insulating layer is arranged between the pixel electrodes and the touch electrodes, and has a plurality of second via holes provided therein. And each touch electrode is electrically connected with one or more first touch lines via one or more second via holes.

In one implementation, each display pixel further comprises a gate, a drain and a source, and the touch panel further comprises a gate insulating layer, a first insulating layer and a second insulating layer. The gate insulating layer is arranged between the source, the drain and the gate, and has a plurality of first via holes provided therein. The second insulating layer is arranged between the source, the drain and the pixel electrodes, and has a plurality of third via holes and a plurality of fourth via holes provided therein, each pixel electrode and each drain being electrically connected via a corresponding third via hole. And the first insulating layer is arranged between the pixel electrodes and the touch electrodes, and has a plurality of second via holes provided therein. If the plurality of first connection lines are arranged in the same layer as the source, the drain and the data lines, the fourth via holes are arranged to have a one-to-one correspondence with the second via holes, such that each first connection line is connected in series with an intermittent first touch line via two corresponding first via holes, and that each first touch line is electrically connected with a corresponding touch electrode via one or more second via holes and one or more fourth via holes. If the plurality of first connection lines are arranged in the same layer as the pixel electrodes, the fourth via holes are arranged to have a one-to-one correspondence with the first via holes, such that each first connection line is connected in series with an intermittent first touch line via two corresponding first via holes and two corresponding fourth via holes, and that each first touch line is electrically connected with a corresponding touch electrode via one or more second via holes.

In one implementation, each display pixel further comprises a source and a drain, and the touch panel further comprises a first insulating layer and a second insulating layer. The second insulating layer is arranged between the source, the drain and the pixel electrode, and has a plurality of third via holes and a plurality of fourth via holes provided therein, each pixel electrode and each drain being electrically connected via a corresponding third via hole. The plurality of second connection lines are arranged in the same layer as the pixel electrodes, each second connection line being connected in series with an intermittent second touch line via two corresponding fourth via holes. And the first insulating layer is arranged between the pixel electrodes and the touch electrodes, and has a plurality of second via holes provided therein, each touch electrode being electrically connected with one or more second touch lines via one or more second via holes.

In one implementation, each display pixel further comprises a source and a drain, and the touch panel further comprises a first insulating layer and a second insulating layer. The second insulating layer is arranged between the source, the drain and the pixel electrodes, and has a plurality of third via holes provided therein, each pixel electrode and each drain being electrically connected via a corresponding third via hole. And the first insulating layer is arranged between the pixel electrodes and the touch electrodes, and has a plurality of second via holes provided therein, each touch electrode being electrically connected with one or more third touch lines via one or more second via holes.

In one implementation, each first touch line is provided with a plurality of via hole connection parts, each of which is located in a disconnection position of a corresponding first touch line in the vicinity of a gate line and protrudes in a direction of the gate line. The first via holes are arranged to have a one-to-one correspondence with the via hole connection parts. And each second via hole is arranged in a random position on a corresponding first connection line.

In one implementation, each first touch line is provided with via hole connection parts, each of which is located in a disconnection position of a corresponding first touch line in the vicinity of a gate line and protrudes in a direction of the gate line. If the plurality of first connection lines are arranged in the same layer as the source, the drain and the data lines, the first via holes are arranged to have a one-to-one correspondence with the via hole connection parts, and each of the second via holes and the fourth via holes is arranged in a random position on a corresponding first connection line. If the plurality of first connection lines are arranged in the same layer as the pixel electrodes, each of the first via holes and the fourth via holes is arranged to have a one-to-one correspondence with a corresponding via hole connection part, and each of the second via holes is arranged in a random position on a corresponding first connection line.

In one implementation, the plurality of first connection lines are made of a same material as the electrodes which are not in the same layer as the gate lines and the touch electrodes, and the first touch lines are made of a same material as the gate lines. Alternatively, the second touch lines are made of a same material as the data lines, and the plurality of second connection lines are made of a same material as the electrodes which are not in the same layer as the data lines and the touch electrodes. Alternatively, the third touch lines are made of a same material as the pixel electrodes.

In one implementation, the touch electrodes are reused as a common electrode of the display pixels.

According to a third aspect of the present disclosure, a touch display device is further provided, comprising any of the touch panels described above.

Embodiments of the present disclosure can reduce the manufacturing process steps of a touch panel and thereby simplify the process. Besides, the thickness of the touch panel can be reduced, which helps to make the touch panel thinner and cut down costs.

BRIEF DESCRIPTION OF DRAWINGS

FIG. 4c is a schematic view showing a state after completing step S13 of a method for manufacturing a touch display panel provided in the second embodiment of the present disclosure;

FIG. 4d is a schematic view showing a state after completing step S14 of a method for manufacturing a touch display panel provided in the second embodiment of the present disclosure;

FIG. 4e is a schematic view showing a state after completing step S15 of a method for manufacturing a touch display panel provided in the second embodiment of the present disclosure;

DETAILED DESCRIPTION OF EMBODIMENTS

Figure 1:
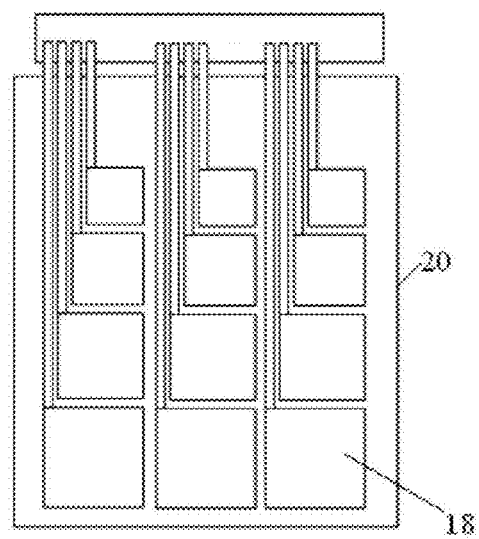
FIG. 1 is a schematic view for a pattern of touch electrodes which is obtained by dividing a common electrode.
Figure 2:
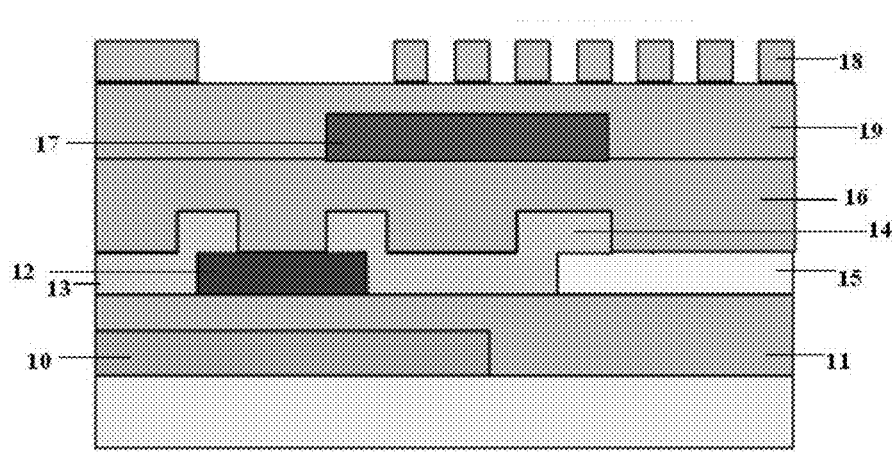
FIG. 2 is a partial longitudinal cross-sectional view for an ordinary self-capacitance in-cell touch panel.

In order to help those skilled in the art to better understand the technical solution of the present disclosure, the touch panel, the manufacturing method thereof and the touch display device provided in the present disclosure shall be described in details as follows with reference to the drawings.

In the present disclosure, an area between two adjacent insulating layers is called a layer. Or in other words, electrically conductive layers not isolated by an insulating layer are in the same layer. Besides, "formed in the same layer" means "located in the same layer", rather than formed simultaneously (i.e., formed synchronously) or formed asynchronously.

The method for manufacturing a touch panel provided in the first embodiment of the present disclosure can comprise the following steps.

First, forming touch lines, comprising: forming in the same layer gate lines and a plurality of first touch lines, each first touch line being arranged intermittently in a direction of data lines and not electrically connected with the gate lines, and forming in the same layer a plurality of first connection lines and electrodes which are not in the same layer as the gate lines and touch electrodes, each first connection line being used for connecting in series with an intermittent first touch line. Each first touch line can form a continuous touch line by means of a plurality of first connection lines, so as to input a drive signal from a non-display region to touch electrodes in a display region and receive a sensing signal from the touch electrodes. Besides, the electrodes which are not in the same layer as the gate and the touch electrodes can comprise a source-drain and a pixel electrode. As is known, the intersecting gate lines and data lines can define display pixels, the display pixels comprising pixel electrodes. A display pixel may further comprise a switching element electrically connected with the pixel electrodes, e.g., a thin film transistor comprising a gate, a source and a drain (as well as an active region).

Second, forming touch electrodes, each touch electrode being electrically connected with one or more first touch lines.

Since the first touch lines are formed in the same layer as the gate lines and the first connection lines are formed in the same layer as other electrodes or connection lines of the touch panel, a step for forming an insulating layer can be avoided, which simplifies the manufacturing process of the touch panel. Besides, the thickness of the touch panel can also be reduced, which helps to make the touch panel thinner.

In this embodiment, the gate and the gate lines can be formed simultaneously. Optionally, the first touch lines and the gate lines are formed simultaneously, and the first connection lines and the electrodes (the drain and the source) which are not in the same layer as the gate lines and the touch electrodes can be formed simultaneously. Specifically, a film layer of the gate and the gate lines can be formed first, and then patterns of the gate, the gate lines and the first touch lines are formed by one patterning process, i.e., the gate, the gate lines and the first touch lines are formed simultaneously. Similarly, a film layer of the drain and the source which are not in the same layer as the gate lines and the touch electrodes can be formed first, and then patterns of the electrodes and the first connection lines are formed by one patterning process, i.e., the drain, the source and the first connection lines are formed simultaneously. The manufacturing process can be further simplified by using one patterning process.

The method for manufacturing a touch panel provided in this embodiment shall be described in details with reference to FIGS. 3a-3g by taking the manufacture of a touch panel of a bottom gate type as an example. The manufacturing method can comprise the following steps.

Figure 3A:
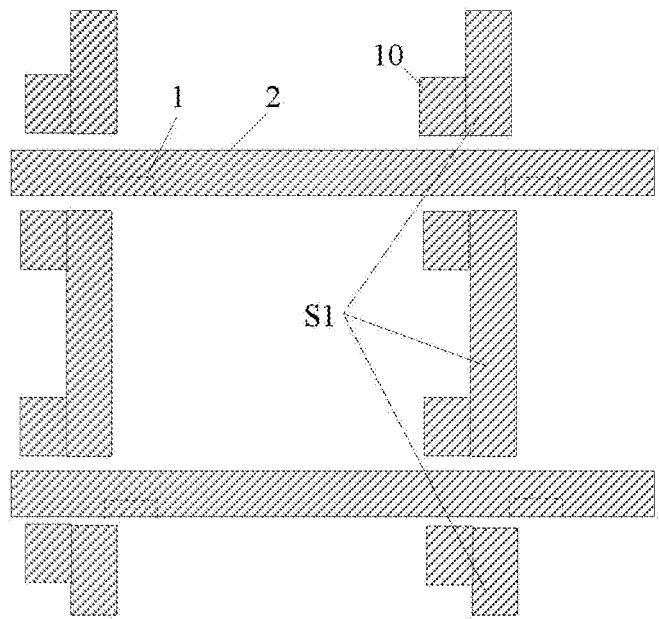
FIG. 3a is a schematic view showing a state after completing step S11 of a method for manufacturing a touch display panel provided in a first embodiment of the present disclosure.
Figure 3B:
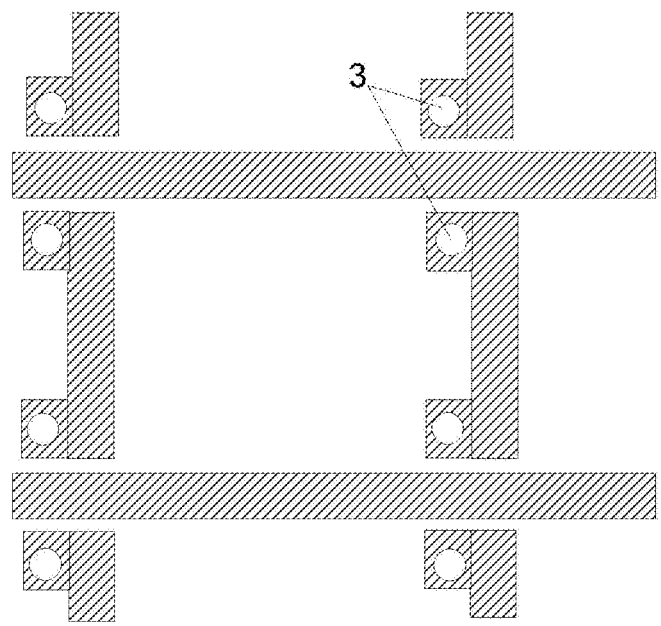
FIG. 3b is a schematic view showing a state after completing step S12 of a method for manufacturing a touch display panel provided in the first embodiment of the present disclosure.
Figure 3C:
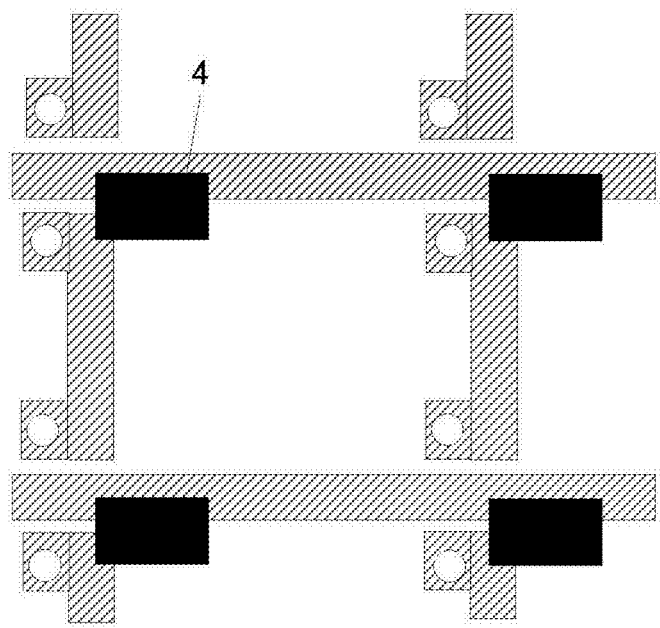
FIG. 3c is a schematic view showing a state after completing step S13 of a method for manufacturing a touch display panel provided in the first embodiment of the present disclosure.

Step S11, forming simultaneously patterns of a gate 1, gate lines 2 and a plurality of first touch lines S1 as shown in FIGS. 3a and 3c. The gate 1 is a part of the gate lines 2 corresponding to an active region 4 as indicated by the dashed line in FIG. 3a.

Step S12, forming between the gate 1 and the active region 4 a gate insulating layer with a plurality of first via holes 3 provided therein as shown in FIG. 3b.

Step S13, forming an active region 4 as shown in FIG. 3c.

Figure 3D:
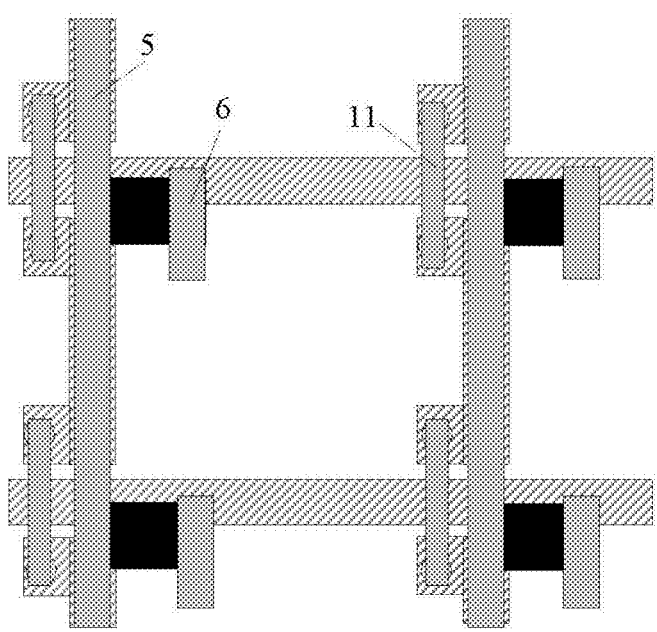
FIG. 3d is a schematic view showing a state after completing step S14 of a method for manufacturing a touch display panel provided in the first embodiment of the present disclosure.

Step S14, forming simultaneously a source, a drain 6, data lines 5 and a plurality of first connection lines 11, each first connection line 11 being connected in series with an intermittent first touch line S1 via two corresponding first via holes 3, so as to from a continuous conductive wire as shown in FIG. 3d. The source is a part of the data lines 5 corresponding to the active region 4, which is not shown.

Figure 3E:
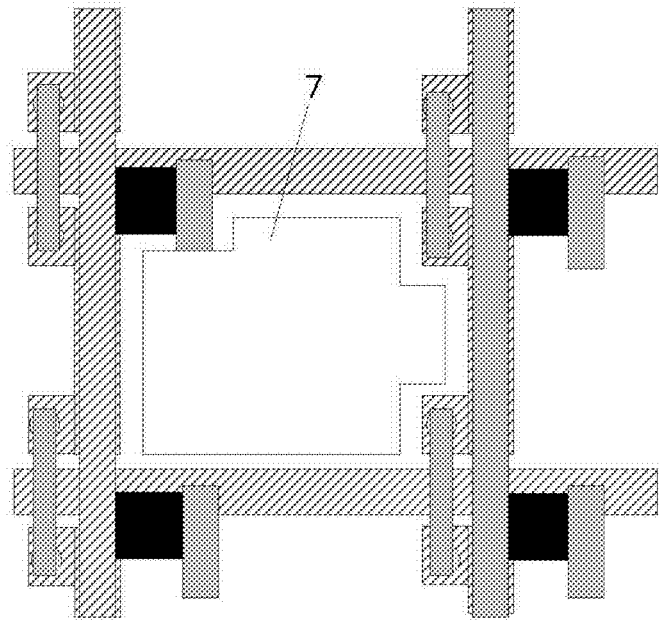
FIG. 3e is a schematic view showing a state after completing step S15 of a method for manufacturing a touch display panel provided in the first embodiment of the present disclosure.

Step S15, forming pixel electrodes 7 which are in the same layer as the source, the drain 6 and the data lines 5 and electrically connected with the drain 6 as shown in FIG. 3e.

Figure 3F:
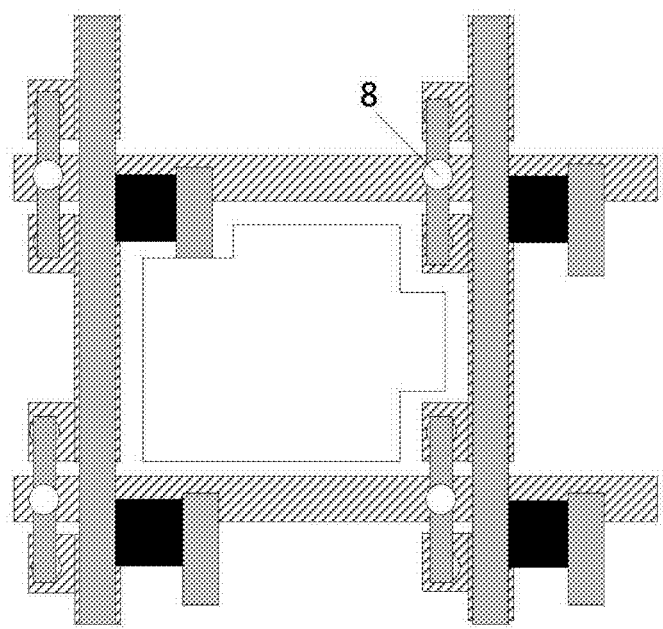
FIG. 3f is a schematic view showing a state after completing step S16 of a method for manufacturing a touch display panel provided in the first embodiment of the present disclosure.

Step S16, forming between the pixel electrodes 7 and the touch electrodes 9 a first insulating layer with a plurality of second via holes 8 provided therein as shown in FIG. 3f.

Figure 3G:
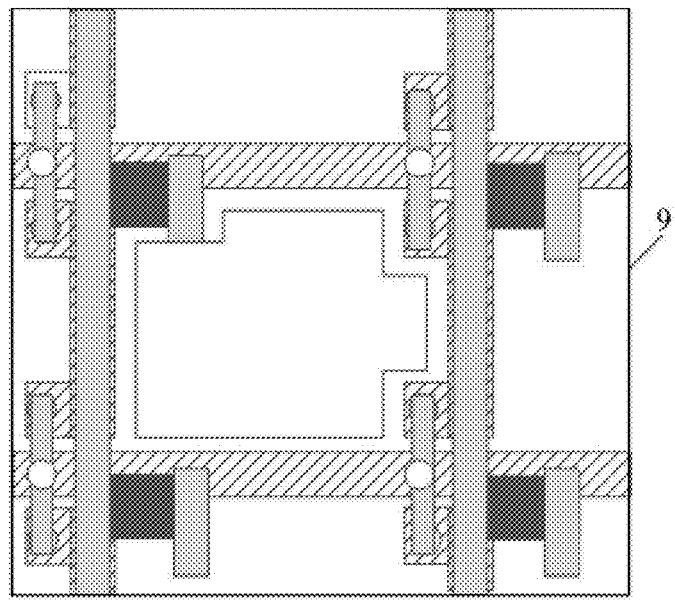
FIG. 3g is a schematic view showing a state after completing step S17 of a method for manufacturing a touch display panel provided in the first embodiment of the present disclosure.

Step S17, forming touch electrodes 9, each touch electrode 9 being electrically connected with one or more touch lines S1 via one or more second via holes 8 as shown in FIG. 3g.

In step S14 of this embodiment, the first via holes 3 are filled at the same time when the film layer of the source, the drain 6 and the data lines 5 is formed, such that the first connection lines 11 are connected in series with the first touch lines S1. In step S17, the second via holes 8 are filled at the same time when the film layer of the touch electrodes 9 is formed, such that the touch electrodes 9 are electrically connected with the first touch lines S1 via the second via holes 8.

Furthermore, as shown in FIG. 3a, each first touch line S1 can be provided with a plurality of via hole connection parts 10, each of which is located in a disconnection position of a first touch line S1 in the vicinity of a gate line 2 and protrudes in a direction of the gate line 2. As shown in FIG. 3b, the first via holes 3 can be arranged to have one-to-one correspondence with the via hole connection parts 10. As shown in FIG. 3f, the second via holes 8 can be arranged in a random position on the first connection lines 11. In this case, connection of the touch electrodes 9 with the first touch lines S1 can be achieved on the premise that the corresponding data lines 5 right above the first touch lines S1 will not be influenced. Obviously, in actual application, connection of the touch electrodes 9 with the first touch lines S1 can also be achieved in other manners without influencing the data lines 5, for example, by arranging the widths of the first touch lines S1 and the first connection lines 11 in the direction of the gate lines 2 to be greater than that of the data lines 5 in the direction of the gate lines 2. However, since arrangement of the via hole connection parts 10 only in the disconnection position increases the width, influence on the aperture ratio can be reduced.

It should be noted that although the first connection lines 11 are formed in step S14 in this embodiment, they can also be formed in step S15 in actual application. In other words, the pixel electrodes 7 and the first connection lines 11 are formed simultaneously. Specifically, the film layer of the pixel electrodes can be formed first, and then patterns comprising the pixel electrodes 7 and the first connection lines 11 are formed by one patterning process, i.e., the pixel electrodes 7 and the first connection lines 11 are formed simultaneously.

Alternatively, the manufacturing method can comprise: forming a second insulating layer between the source, the drain and the pixel electrodes 7. The second insulating layer is optionally a resin layer and provided with a plurality of third via holes and a plurality of fourth via holes (not shown) therein. The third via holes and the fourth via holes will be filled when the film layer of the pixel electrodes 7 is formed, such that each pixel electrode 7 and each drain 6 are electrically connected via a corresponding third via hole. There are situations as follows.

As a first case, the first connection lines 11 and the source-drain and the data lines 5 are formed simultaneously. In this case, the fourth via holes are arranged to have a one-to-one correspondence with the second via holes 8, such that each first connection line 11 is connected in series with a first touch line S1 via two corresponding first via holes 3, and that each first touch line S1 is electrically connected with a corresponding touch electrode 9 via one or more second via holes 8 or one or more fourth via holes.

As a second case, the first connection lines 11 and the pixel electrodes 7 are formed simultaneously. In this case, the fourth via holes are arranged to have a one-to-one correspondence with the first via holes 3, such that each first connection line 11 is connected in series with a first touch line S1 via two corresponding first via holes 3 and two corresponding fourth via holes, and that each first touch line S1 is electrically connected with a corresponding touch electrode 9 via one or more second via holes 8.

By means of the second insulating layer, not only the electrical insulation between the source, the drain and the pixel electrodes 7 is improved, but also the touch electrodes 9 is elevated such that the influence of the data lines 5 and the gate lines 2 on the touch electrodes 9 is reduced.

It should be further noted that if the above via hole connection parts 10 are used, in the first case above, the first via holes 3 are arranged to correspond to the via hole connection parts 10, and the second via holes 8 are arranged to have a one-to-one correspondence with the fourth via holes and correspond to a random position on the first connection lines 11. In the second case above, the first via holes 3 are arranged to have a one-to-one correspondence with the fourth via holes and correspond to the via hole connection parts 10, and the second via holes 8 are arranged in a random position on the first connection lines 11. Herein, the term "correspond" and its variation mean "stack".

This embodiment gives explanations by taking the manufacture of a touch panel of a bottom gate type as an example. In actual application, it only needs to execute the above steps reversely in order to manufacture a touch panel of a top gate type. Besides, in this embodiment, the touch electrodes 9 are reused as a common electrode. However, in actual application, the touch electrodes can further be electrodes independent of the common electrode. Besides, length and position of the first touch lines S1 can be arranged upon needs.

To sum up, the method for manufacturing a touch panel provided in this embodiment only comprises seven process steps, which, as compared with the prior art, can save not only a step for forming touch lines between the pixel electrodes 7 and the touch electrodes 9, but also a step for forming an insulating layer between the pixel electrodes 7 and the touch lines. Therefore, the manufacturing process of the touch panel is simplified and the thickness of the touch panel is reduced, which helps to make the touch panel thinner.

The method for manufacturing a touch panel provided in the second embodiment of the present disclosure is similar to the above method for manufacturing a touch panel provided in the first embodiment, and only the differences therebetween shall be described as follows.

In the second embodiment, the step of forming touch lines comprises: forming in the same layer data lines and a plurality of second touch lines, each second touch line being arranged intermittently in a direction of the gate lines and not electrically connected with the data lines, and forming in the same layer a plurality of second connection lines and electrodes which are not in the same layer as the data lines and the touch electrodes, each of the second connection lines being used for connecting in series with an intermittent second touch line. The plurality of second connection lines can allow the second touch lines to form a continuous touch line, so as to input a drive signal from a non-display region to touch electrodes in a display region and receive a sensing signal from the touch electrodes.

Besides, the step of forming touch electrodes comprises: forming touch electrodes electrically connected with the second touch lines.

Since the second touch lines are formed in the same layer as the data lines and the second connection lines are formed in the same layer as other electrodes or connection lines of the touch panel, this embodiment can also save a step for forming an insulating layer and meanwhile reduce the thickness of the touch panel.

In this embodiment, the source, the drain and the data lines can be formed simultaneously. Optionally, the second touch lines and the data lines are formed simultaneously, and the second connection lines are formed simultaneously with the electrodes which are not in the same layer as the data lines and the touch electrodes, and the electrodes which are not in the same layer as the source, the drain and the touch electrodes can comprise pixel electrodes. Specifically, a film layer of the source, the drain and the data lines can be formed first, and then patterns of the source, the drain, the data lines and the second touch lines can be formed by one patterning process, i.e., the source, the drain, the data lines and the second touch lines are formed simultaneously. Similarly, a film layer of the pixel electrodes which are not in the same layer as the source, the drain and the touch electrodes can be formed first, and then patterns of the pixel electrodes and the second connection lines are formed by one patterning process, i.e., the pixel electrodes and the second connection lines are formed simultaneously. The manufacturing process can be further simplified by using one patterning process.

The method for manufacturing a touch panel provided in this embodiment shall be described in details with reference to FIGS. 4a-4h by taking the manufacture of a touch panel of a bottom gate type as an example. The manufacturing method can comprise the following steps.

Figure 4A:
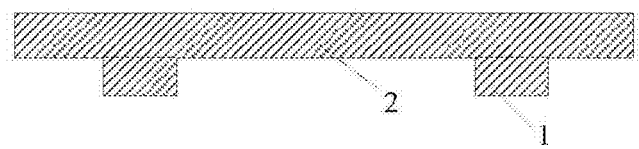
FIG. 4a is a schematic view showing a state after completing step S11 of a method for manufacturing a touch display panel provided in a second embodiment of the present disclosure.

Step S11, forming a gate 1 and gate lines 2 as shown in FIG. 4a.

Figure 4B:
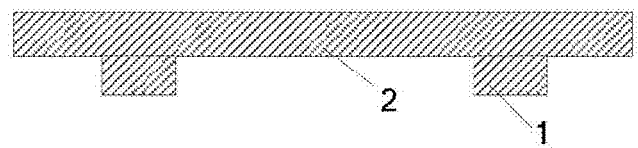
FIG. 4b is a schematic view showing a state after completing step S12 of a method for manufacturing a touch display panel provided in the second embodiment of the present disclosure.

Step S12, forming a gate insulating layer between the gate 1 and an active region 4 as shown in FIGS. 4b and 4c.

Step S13, forming an active region 4 between the source, the drain and the gate insulating layer as shown in FIG. 4c.

Step S14, forming simultaneously a source, a drain 6, data lines 5 and a plurality of second touch lines S2 as shown in FIG. 4d. The source is a part of the data lines 5 corresponding to the active region 4, which is not shown.

Step S15, forming a second insulating layer between the source, the drain and pixel electrodes 7. Specifically, the second insulating layer is a resin layer and provided with a plurality of third via holes 12 and a plurality of fourth via holes 13 as shown in FIG. 4e.

Figure 4F:
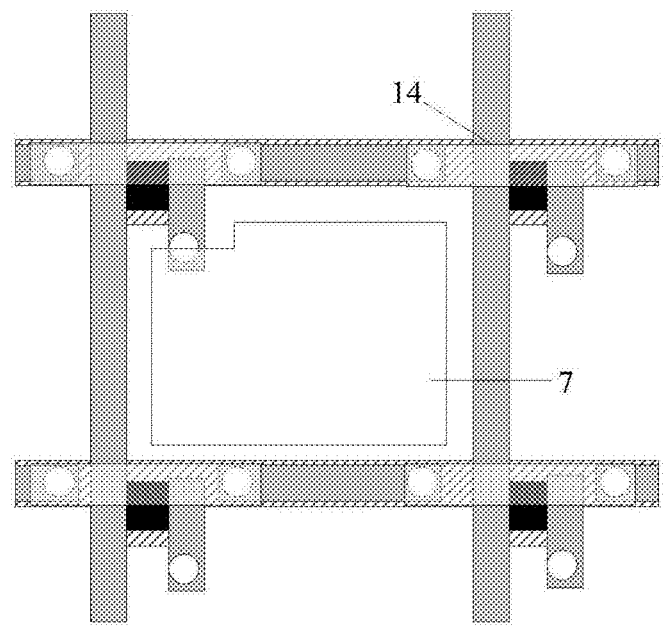
FIG. 4f is a schematic view showing a state after completing step S16 of a method for manufacturing a touch display panel provided in the second embodiment of the present disclosure.

Step S16, forming simultaneously pixel electrodes 7 and a plurality of second connection lines 14, each second connection lines 14 being connected in series with the second touch lines S2 via two corresponding fourth via holes 13, such that the second touch lines S2 form a continuous touch line as shown in FIG. 4f.

Figure 4G:
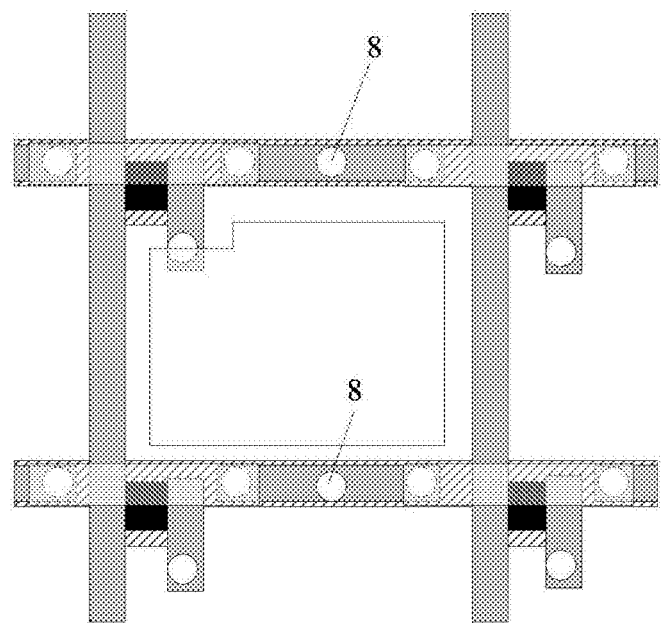
FIG. 4g is a schematic view showing a state after completing step S17 of a method for manufacturing a touch display panel provided in the second embodiment of the present disclosure.

Step S17, forming between the pixel electrodes 7 and touch electrodes 9 a first insulating layer with a plurality of second via holes 8 provided therein as shown in FIG. 4g.

Figure 4H:
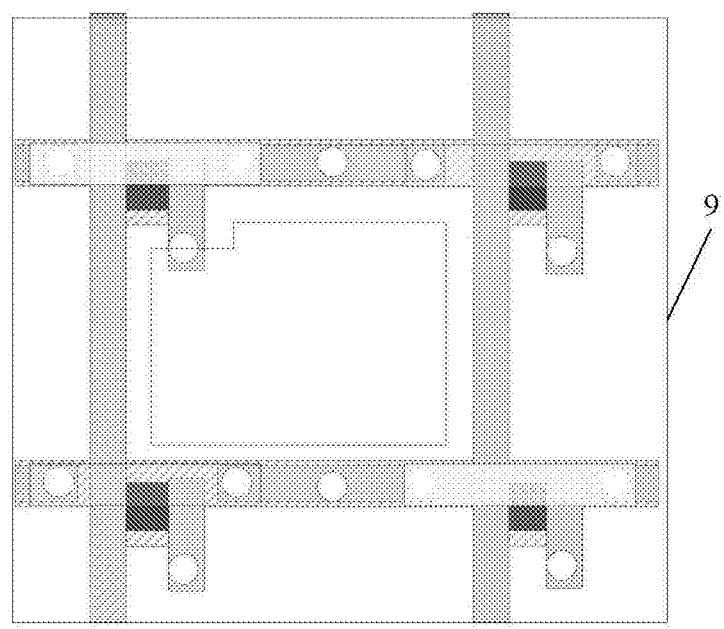
FIG. 4h is a schematic view showing a state after completing step S18 of a method for manufacturing a touch display panel provided in the second embodiment of the present disclosure.

Step S18, forming touch electrodes 9, each touch electrode 9 being electrically connected with one or more second touch lines S2 via one or more second via holes 8 as shown in FIG. 4h.

In step S16 of this embodiment, the third via holes 12 and the fourth via holes 13 are filled at the same time when the film layer of the pixel electrodes 7 is formed, such that the pixel electrodes 7 are electrically connected with the drain 6 via a corresponding third via hole 12 and that the second connection lines 14 are connected in series with the second touch lines S2 via two corresponding fourth via holes 13. In step S18, the second via holes 8 will be filled at the same time when the film layer of the touch electrodes 9 is formed, such that the touch electrodes 9 are electrically connected with the second touch lines S2 via the second via holes 8.

This embodiment has the following advantages as compared with the first embodiment.

Firstly, the layer of the second touch lines S2 is closer to the touch electrodes 9 than the layer of the first touch lines S1, such that the widths of the second touch lines S2 and the second connection lines 14 in the direction of the data lines 5 are smaller than that of the gate lines 2, which leads to a higher aperture ratio.

Secondly, the process for arranging the first via holes 3 in the gate line insulating layer can be saved, which further simplifies the manufacturing process.

Thirdly, the plurality of second touch lines S2 can be led out from both sides of an array substrate via leads respectively and then connected with an external IC, such that the plurality of second touch lines S2 are connected in parallel (in the first embodiment above, the plurality of first touch lines S1 can only be lead out from one side via leads and connected with an external IC), and therefore the touch resistance is reduced.

However, an external IC is generally arranged at two ends in a direction of the data lines such that the second touch lines S2 cannot be electrically connected with the external IC until they are driven after being led out from both sides of the array substrate. In the first embodiment, the first touch lines S1 can be directly connected with the external IC via the pixel regions. Therefore, as compared with this embodiment, the first embodiment can reduce the interference of noise.

The method for manufacturing a touch panel provided in this embodiment only requires eight process steps (in case a second insulating layer is provided between the source, the drain and the pixel electrodes 7), which, as compared with the prior art, can save not only a step for forming touch lines between the pixel electrodes 7 and the touch electrodes 9, but also a step for forming an insulating layer between the pixel electrodes 7 and the touch lines. Therefore, the manufacturing process of a touch panel is simplified and the thickness of the touch panel is reduced, which helps to make the touch panel thinner.

The method for manufacturing a touch panel provided in the third embodiment of the present disclosure is similar to the above method for manufacturing a touch panel provided in the second embodiment, and only the differences therebetween shall be described as follows.

In this embodiment, the step of forming touch lines is: forming in the same layer a plurality of third touch lines and pixel electrodes which are not in the same layer as the data lines and the gate lines, each third touch line being a touch line arranged continuously. Since the third touch lines are not in the same layer as the gate lines and the data lines, they will not interfere with the data lines and the gate lines. Therefore, the third touch lines can be continuous touch lines, which, as compared with the first and second embodiments, can avoid arranging the first connection lines or the second connection lines and hence simplify the structure of the touch panel.

Besides, the step of forming touch electrodes comprises: forming touch electrodes electrically connected with the third touch lines.

Since the third touch lines are formed in the same layer as the pixel electrodes, this embodiment can also save a step for forming an insulating layer and meanwhile reduce the thickness of the touch panel.

Optionally, the plurality of third touch lines and the pixel electrodes can be formed simultaneously. Specifically, a film layer of the pixel electrodes can be formed first, and then patterns of the pixel electrodes and the plurality of third touch lines are formed by one patterning process, i.e., the pixel electrodes and the plurality of third touch lines are formed simultaneously. The manufacturing process can be further simplified by using one patterning process. Besides, since the pixel electrodes are transparent electrodes, the third touch lines manufactured at the same time are also transparent conductive wires, such that the third touch lines will not influence the aperture ratio. The arrangement direction and position of the third touch lines can be flexibly arranged upon actual situations.

Likewise, similar to the second embodiment, by taking a touch panel of a bottom gate type as an example, the second insulating layer is provided with a plurality of third via holes (with reference to step S15 of the second embodiment), rather than fourth via holes. Each touch electrode is electrically connected with one or more third touch lines via one or more second via holes.

In actual application, if the third touch lines and the pixel electrode are not formed synchronously and the third touch lines are made of a non-transparent material, in order to avoid influence on the aperture ratio of the pixels, the third touch lines should be arranged in a direction of the gate lines or in a direction of the data lines.

According to another aspect of the present disclosure, a touch panel is further provided respectively corresponding to first, second and third embodiments of the aforementioned manufacturing method.

A touch panel corresponding to the first embodiment above (with reference to FIGS. 3a-3g) comprises a gate 1, gate lines 2, a gate insulating layer, an active region 4, a source-drain, data lines 5, pixel electrodes 7, a first insulating layer, touch electrodes 9 and touch lines. The touch lines comprise first touch lines S1 intermittently arranged in a direction of the data lines 5 and not electrically connected with the gate lines 2, as well as first connection lines 11 for connecting in series with the first touch lines S1, the first touch lines S1 being arranged in the same layer as the gate lines 2. Since the gate 1 and the gate lines 2 are arranged in the same layer, the first touch lines S1, the gate 1 and the gate lines 2 are arranged in the same layer. The first connection lines 11 are arranged in the same layer as the electrodes which are not in the same layer as the gate lines 2 and the touch electrodes 9. In this embodiment, the electrodes which are not in the same layer as the gate lines 2 and the touch electrodes 9 comprise the source-drain and the pixel electrodes 7.

The gate insulating layer is arranged between the gate 1 and the active region 4 and has a plurality of first via holes 3 provided therein. The first connection lines 11 are arranged in the same layer as the source-drain, the data lines 5 and the pixel electrodes 7, and each first connection line 11 is connected in series with a first touch line S1 via two corresponding first via holes 3. The first insulating layer is arranged between the pixel electrodes 7 and the touch electrodes 9 and has a plurality of second via holes 8 provided therein. Each touch electrode 9 is electrically connected with one or more first touch lines S1 via one or more second via holes 8.

Optionally, the first connection lines 11 are made of a same material as the electrodes which are not in the same layer as the gate lines 2 and the touch electrodes 9, and the first touch lines S1 are made of a same material as the gate lines 2. In other words, the first connection lines 11 can be formed simultaneously with the electrodes which are not in the same layer as the gate lines 2 and the touch electrodes 9, and the first touch lines S1 and the gate lines 2 can be formed simultaneously.

Optionally, the first touch lines S1 are provided with a plurality of via hole connection parts 10, each of which is located in a disconnection position of a first touch line S1 in the vicinity of a gate line 2 and protrudes in a direction of the gate line 2. The first via holes 3 are arranged to correspond to the via hole connection parts 10. The second via holes 8 are arranged in a random position on the first connection lines 10. In this case, connection of the touch electrodes 9 with the first touch lines S1 can be achieved on the premise that the data lines right above the first touch lines S1 will not be influenced. As mentioned above, in actual application, connection of the touch electrodes 9 with the first touch lines S1 can also be achieved in other manners without influencing the data lines 5, for example, by arranging the widths of the first touch lines S1 and the first connection lines 11 in the direction of the gate lines 2 to be greater than that of the data lines 5 in the direction of the gate lines 2.

The touch panel can further comprise a second insulating layer, the second insulating layer being arranged between the source-drain and the pixel electrodes 7 and having a plurality of third via holes and a plurality of fourth via holes provided therein. The pixel electrodes 7 are electrically connected with the drain 6 via a corresponding third via hole. If the first connection lines 11 are arranged in the same layer as the source-drain and the data lines 5, the first connection lines 11 are connected in series with the first touch lines S1 via two corresponding first via holes 3, and each touch electrode 9 is electrically connected with one or more first touch lines S1 via one or more second via holes 8 and one or more fourth via holes. If the first connection lines 11 are arranged in the same layer as the pixel electrodes 7, the first connection lines 11 are connected in series with the first touch lines S1 via two corresponding first via holes 3 and two corresponding fourth via holes, and each touch electrode 9 is electrically connected with one or more first touch lines S1 via one or more second via holes 8.

Furthermore, if the above via hole connection parts 10 are used and the first connection lines 11 are arranged in the same layer as the source-drain and the data lines 5, the first via holes 3 are arranged to correspond to the via hole connection parts 10, and the second via holes 8 are arranged to have a one-to-one correspondence with the fourth via holes, and correspond to a random position on the first connection lines 11. If the above via hole connection parts 10 are used and the first connection lines 11 are arranged in the same layer as the pixel electrodes 7, the first via holes 3 are arranged to have a one-to-one correspondence with the fourth via holes and correspond to the via hole connection parts 10, and the second via holes 8 are arranged in a random position on the first connection lines 11. As mentioned above, the term "correspond" and its variation mean "stack".

In this embodiment, the touch electrodes 9 can be either reused as a common electrode or independent of the common electrode. Besides, length and position of the first touch lines S1 can be arranged upon needs.

A touch panel corresponding to the second embodiment above (with reference to FIGS. 4a-4h) comprises a gate 1, gate lines 2, a gate insulating layer, an active region 4, a source-drain, data lines 5, a second insulating layer, pixel electrodes 7, a first insulating layer, touch electrodes 9 and touch lines.

Specifically, the touch lines comprise second touch lines S2 intermittently arranged in a direction of the gate lines 2 and not electrically connected with the data lines 5, as well as second connection lines 14 for connecting in series with the second touch lines S2, the second touch lines S2 being arranged in the same layer as the data lines 5. Since the source-drain and the data lines 5 are arranged in the same layer, the second touch lines S2, the source-drain and the data lines 5 are arranged in the same layer. The second connection lines 14 are arranged in the same layer as electrodes which are not in the same layer as the data lines 5 and the touch electrodes 9. Specifically, the electrodes which are not in the same layer as the source-drain and the touch electrodes 9 comprise pixel electrodes 7. Therefore, the second connection lines 14 are arranged in the same layer as the pixel electrodes 7, and connected in series with the second touch lines S2 via the fourth via holes 13.

Optionally, the second touch lines are made of a same material as the data lines, and the second connection lines are made of a same material as the electrodes which are not in the same layer as the data lines and the touch electrodes. In other words, the second touch lines and the data lines can be formed simultaneously, and the second connection lines can be formed simultaneously with the electrodes which are not in the same layer as the data lines and the touch electrodes.

A touch panel corresponding to the third embodiment above comprises a gate 1, gate lines 2, a gate insulating layer, an active region 4, a source-drain, data lines 5, a second insulating layer, pixel electrodes 7, a first insulating layer, touch electrodes 9 and touch lines.

Specifically, the touch lines are continuous third touch lines, the third touch lines being arranged in the same layer as the electrodes which are not in the same layer as the data lines and the gate lines. Since the third touch lines are not in the same layer as the data lines 5 and the gate lines 2, the third touch lines will not interfere with the data lines 5 and the gate lines 2. By means of continuous third touch lines, arrangement of the first connection lines 11 or the second connection lines 14 can be avoided, which simplifies the structure of the touch panel.

Besides, as mentioned above, the second insulating layer is provided with a plurality of third via holes 12, rather than fourth via holes 13. Each touch electrode 9 is electrically connected with one or more third touch lines via one or more second via holes 8.

Optionally, the third touch lines are made of a same material as the pixel electrodes. That is, the third touch lines and the pixel electrodes 7 can be formed simultaneously. Besides, since the pixel electrodes 7 is a transparent electrode, the third touch lines manufactured at the same time are also transparent conductive wires, such that the third touch lines will not influence the aperture ratio. The arrangement direction and position of the third touch lines can be flexibly arranged upon actual situations.

In actual application, if the third touch lines are made of a different material than the pixel electrodes, i.e., the third touch lines are made of a non-transparent material, in order to avoid influence on the aperture ratio of the pixels, the third touch lines should be arranged in a direction of the gate lines or in a direction of the data lines.

According to yet another aspect of the present disclosure, a touch display device is further provided, comprising any of the touch panels described above. Specifically, the touch display device can be any product or component having a display function, such as a liquid crystal panel, electronic paper, an OLED panel, a handset, a tablet computer, a television, a display, a notebook computer, a digital photo frame and a navigator.

By studying the drawings, the content of this disclosure and claims appended thereto, those skilled in the art can understand and implement other deformations of the disclosed embodiments when practicing the disclosure sought for protection. In the claims, the word "comprise" does not exclude the presence of other elements or steps, and the indefinite article "a" or "an" does not exclude the presence of a plurality of such elements. The mere fact that certain measures are stated in mutually different dependent claims does not indicate that the combination of these measures cannot be used to advantage.

It can be understood that the above implementations are only exemplary implementations for explaining the principles of the present disclosure, but the present disclosure is not limited thereto. Those having ordinary skills in the art can make various modifications and improvements without deviating from the spirit and the essence of the present disclosure, and such modifications and improvements should also be regarded as falling within the protection scope of the present disclosure.

The invention claimed is:

1. A method for manufacturing a touch panel, the touch panel comprising intersecting gate lines and data lines, touch electrodes and a plurality of touch lines, the gate lines and the data lines defining display pixels comprising pixel electrodes, the method comprising the following steps:
    forming touch lines, comprising:
    forming in the same layer gate lines and a plurality of first touch lines, each first touch line being arranged intermittently in a direction of data lines and not electrically connected with the gate lines, and forming in the same layer a plurality of first connection lines and electrodes which are not in the same layer as the gate lines and the touch electrodes, each first connection line being used for connecting in series with an intermittent first touch line, each touch line comprising a first touch line and a plurality of first connection lines; or
    forming in the same layer data lines and a plurality of second touch lines, each second touch line being arranged intermittently in a direction of the gate lines and not electrically connected with the data lines, and forming in the same layer a plurality of second connection lines and electrodes which are not in the same layer as the data lines and the touch electrodes, each second connection line being used for connecting in series with an intermittent second touch line, each touch line comprising a second touch line and a plurality of second connection lines; or
    forming in the same layer a plurality of third touch lines and pixel electrodes which are not in the same layer as the data lines and the gate lines, each third touch line being arranged continuously, each touch line comprising a third touch line; and
    forming touch electrodes, each touch electrode being electrically connected with one or more first touch lines, one or more second touch lines, or one or more third touch lines.

2. The method according to claim 1, each display pixel further comprising a gate, a drain, a source and an active region, the touch panel further comprising a gate insulating layer and a first insulating layer, wherein forming touch lines comprises:
forming in the same layer a gate, gate lines and a plurality of first touch lines;
forming between the gate and the active region a gate insulating layer with a plurality of first via holes provided therein;
forming in the same layer a source, a drain, data lines, pixel electrodes and a plurality of first connection lines; and
forming between the pixel electrodes and the touch electrodes a first insulating layer with a plurality of second via holes provided therein; and
wherein forming touch electrodes comprises: electrically connecting each touch electrode with one or more first touch lines via one or more second via holes.

3. The method according to claim 1, each display pixel further comprising a gate, a drain, a source and an active region, the touch panel further comprising a gate insulating layer and a second insulating layer,
wherein forming touch lines comprises:
forming in the same layer a gate, gate lines and a plurality of first touch lines;
forming between the gate and the active region a gate insulating layer with a plurality of first via holes provided therein;
forming between the source, the drain and the pixel electrode a second insulating layer with a plurality of third via holes and a plurality of fourth via holes provided therein, each pixel electrode and each drain being electrically connected via a corresponding third via hole; and
forming between the pixel electrodes and the touch electrodes a first insulating layer with a plurality of second via holes provided therein; and
wherein forming the touch electrodes comprises:
arranging the fourth via holes to have a one-to-one correspondence with the second via holes, such that each first connection line is connected in series with an intermittent first touch line via two corresponding first via holes and that each first touch line is electrically connected with a corresponding touch electrode via one or more second via holes and one or more fourth via holes, if the plurality of first connection lines, the source, the drain and the data lines are formed in the same layer;
arranging the fourth via holes to have a one-to-one correspondence with the first via holes, such that each first connection line is connected in series with an intermittent first touch line via two corresponding first via holes and two corresponding fourth via holes and that each first touch line is electrically connected with a corresponding touch electrode via one or more second via holes, if the plurality of first connection lines and the pixel electrodes are formed in the same layer.

4. The method according to claim 1, each display pixel further comprising a drain and a source, the touch panel further comprising a second insulating layer and a first insulating layer,
wherein forming touch lines comprises:
forming in the same layer a source, a drain, data lines and a plurality of second touch lines;
forming between the source, the drain and the pixel electrodes a second insulating layer with a plurality of third via holes and a plurality of fourth via holes provided therein, each pixel electrode and each drain being electrically connected via a corresponding third via hole;

forming in the same layer pixel electrodes and a plurality of second connection lines, each second connection line being connected in series with an intermittent second touch line via two corresponding fourth via holes; and
forming between the pixel electrodes and the touch electrodes a first insulating layer with a plurality of second via holes provided therein; and
wherein forming the touch electrodes comprises: electrically connecting each touch electrode with one or more second touch lines via one or more second via holes.

5. The method according to claim 1, each display pixel further comprising a drain and a source, the touch panel further comprising a second insulating layer and a first insulating layer,
wherein forming touch lines comprises:
forming in the same layer a source, a drain and data lines;
forming between the source, the drain and the pixel electrodes a second insulating layer with a plurality of third via holes provided therein, each pixel electrode and each drain being electrically connected via a corresponding third via hole;
forming in the same layer pixel electrodes and a plurality of third touch lines;
forming between the pixel electrodes and the touch electrodes a first insulating layer with a plurality of second via holes provided therein; and
wherein forming touch electrodes comprises: electrically connecting each touch electrode with one or more third touch lines via one or more second via holes.

6. The method according to claim 2, wherein each first touch line is provided with a plurality of via hole connection parts, each of which is located in a disconnection position of a corresponding first touch line in the vicinity of a gate line and protrudes in a direction of the gate line; the first via holes are arranged to have a one-to-one correspondence with the via hole connection parts; and each second via hole is arranged in a random position on a corresponding first connection line.

7. The method according to claim 3, wherein each first touch line is provided with a plurality of via hole connection parts, each of which is located in a disconnection position of a corresponding first touch line in the vicinity of a gate line and protrudes in a direction of the gate line;
wherein forming the touch electrodes further comprises:
arranging the first via holes to have a one-to-one correspondence with the via hole connection parts, and arranging each of the second via holes and the fourth via holes in a random position on a corresponding first connection line, if the plurality of first connection lines, the source, the drain and the data lines are formed in the same layer;
arranging each of the first via holes and the fourth via holes to correspond to a corresponding via hole connection part, and arranging each of the second via holes in a random position on a corresponding first connection line, if the plurality of first connection lines and the pixel electrodes are formed in the same layer.

8. The method according to claim 1, wherein forming touch lines comprises:
forming simultaneously gate lines and the plurality of first touch lines, and forming simultaneously the plurality of first connection lines and electrodes which are not in the same layer as the gate lines and the touch electrodes; or
forming simultaneously data lines and the plurality of second touch lines, and forming simultaneously the plurality of second connection lines and electrodes which are not in the same layer as the data lines and the touch electrodes; or forming simultaneously pixel electrodes and the plurality of third touch lines.

\* \* \* \* \*